(12) United States Patent
Hlotyak et al.

(10) Patent No.: US 7,171,587 B2
(45) Date of Patent: Jan. 30, 2007

(54) AUTOMATIC TEST SYSTEM WITH EASILY MODIFIED SOFTWARE

(75) Inventors: Stephen J. Hlotyak, Belmont, MA (US); Alan L. Blitz, Newton, MA (US); Randall B. Stimson, Boston, MA (US)

(73) Assignee: Teradyne, Inc., North Reading, MA (US)

( * ) Notice: Subject to any disclaimer, the term of this patent is extended or adjusted under 35 U.S.C. 154(b) by 541 days.

(21) Appl. No.: 10/460,104

(22) Filed: Jun. 12, 2003

(65) Prior Publication Data

US 2004/0215361 A1 Oct. 28, 2004

Related U.S. Application Data

(60) Provisional application No. 60/466,127, filed on Apr. 28, 2003.

(51) Int. Cl.
G06F 11/00 (2006.01)
(52) U.S. Cl. .................. 714/30; 714/742; 702/121
(58) Field of Classification Search ............... 702/121; 714/742, 30
See application file for complete search history.

(56) References Cited

U.S. PATENT DOCUMENTS

| | | | | |
|---|---|---|---|---|
| 4,397,021 A * | 8/1983 | Lloyd et al. ............... 714/33 |
| 4,550,406 A * | 10/1985 | Neal ...................... 714/734 |
| 5,138,252 A * | 8/1992 | Ferguson ................ 324/76.19 |
| 5,589,765 A * | 12/1996 | Ohmart et al. ........... 324/158.1 |
| 5,632,022 A * | 5/1997 | Warren et al. ............. 715/776 |
| 5,727,212 A * | 3/1998 | Dinallo ................... 719/321 |
| 5,745,761 A * | 4/1998 | Celi et al. ................ 719/323 |
| 5,788,084 A * | 8/1998 | Onishi et al. ............. 209/573 |
| 5,828,674 A | 10/1998 | Proskauer |
| 5,910,895 A | 6/1999 | Proskauer et al. |
| 5,963,726 A * | 10/1999 | Rust et al. ................ 703/13 |
| 6,047,293 A | 4/2000 | Blitz |
| 6,128,759 A * | 10/2000 | Hansen ................... 714/738 |
| 6,134,674 A * | 10/2000 | Akasheh .................. 714/33 |
| 6,223,134 B1 * | 4/2001 | Rust et al. ............... 702/121 |
| 6,279,131 B1 * | 8/2001 | Archambeau et al. ..... 714/737 |
| 6,487,514 B1 * | 11/2002 | Wong-Lam et al. ....... 702/119 |
| 6,571,185 B1 * | 5/2003 | Gauland et al. ........... 702/68 |
| 6,594,599 B1 * | 7/2003 | Kent et al. ................ 702/84 |
| 6,681,351 B1 | 1/2004 | Kittross |
| 2002/0078283 A1 | 6/2002 | Purcell et al. ........... 368/710 |

OTHER PUBLICATIONS

Fertitta, Kirk, "IVI Standards Tutorial", Agilent Developer Network White Paper, Nov. 2002 pp. 1-5.*

(Continued)

Primary Examiner—Bryce P. Bonzo
(74) Attorney, Agent, or Firm—Fish & Richardson P.C.

(57) ABSTRACT

An automatic test system, such as might be used to test semiconductor devices as part of their manufacture. The test system uses instruments to generate and measure test signals. The automatic test system has a hardware and software architecture that allows instruments to be added to the test system after it is manufactured. The software is segregated into instrument specific and instrument independent software. Predefined interfaces to the software components allow for easy integration of instruments into the test system and also easy reuse of the software as the physical implementation of the test system or the instruments changes from tester to tester in a product family.

19 Claims, 5 Drawing Sheets

OTHER PUBLICATIONS

Harvery, John, IVI-COM Drivers in Visual Basic 6, Agilent Developer Network White Paper, Nov. 2002, pp. 1-12.*

Agilent Developer Network, "Agilent 3499 IVI-COM Driver Read Me", Jan. 24, 2003, pp. 1-4.*

Neblett, B., "Implementing reusable, instrument independent test programs in the factory," AUTOTESTCON (Proceedings), 1996. pp. 206-212.*

Williams, Stephen R., "Test and Measurement Equipment Adopts Computer Industry Standards" Oct. 10, 2002, Systems Readiness Technology Conference, Auto TestCon 2002, Huntsville, AL, Oct. 15-17, 2002, IEEE AutoTestCon proceedings: IEEE Systems Readiness Technology Conference, New York, NY, pp. 367-378.

Atchison, L., "Firewire: standard computer industry interconnect for test and measurement AutoTestCon '98" Aug. 24, 1998, IEEE Systems Readiness Technology Conference, 1998 IEEE Salt Lake City, UT, Aug. 24-27, 1998, New York, NY, pp. 272-275.

Copy of European Office Action for Application No. 04755043.9, dated Mar. 9, 2006.

* cited by examiner

AUTOMATIC TEST SYSTEM WITH EASILY MODIFIED SOFTWARE

RELATED APPLICATIONS

This Application claims priority to U.S. Provisional Application 60/466,127; filed Apr. 28, 2003; titled "Automatic Test System with Easily Modified Software."

BACKGROUND

This invention relates generally to software architectures and more specifically to software for automatic test systems.

Automatic test systems (referred to generally as "testers") are used in the manufacture of semiconductor devices. Often, a semiconductor device is tested at more than one stage during its manufacture and further processing of the device is determined by the results of the test. In some instances, a device that fails a test is discarded. In other instances, devices can be repaired. For example, the device might be constructed with redundant circuitry. If a faulty portion of the device is identified through testing, the defective circuitry might be disconnected and a redundant circuit element connected in its place. In yet other cases, testing is used for grading of parts. For example, some devices operate only up to a certain speed or only operate at a range of temperatures that is less than the intended operating range of the device. These devices might be separated from other devices that fully meet the design specification and then specially packaged or sold as lower grade parts. Regardless of the specific actions taken in response to the testing, testing is an important part of the manufacturing process.

It is highly desirable for an automatic test system to be as easy to use as possible. One way that ease of use might be achieved is through the provision of software.

U.S. Pat. No. 5,910,895 entitled Low Cost, Easy To Use Automatic Test System Software by Proskauer et al. describes a software system for an automatic test system that is based on using a commercially available spread sheet program to represent the data and program flow needed to define a test program. U.S. Pat. No. 6,047,293 entitled System For Storing And Searching Named Device For Parameter Data In A Test System For Testing An Integrated Circuit by Blitz describes software that facilitates programming of a test system. U.S. Pat. No. 5,828,674 entitled Production Interface For An Integrated Circuit Test System describes a software system, also for automatic test equipment, that makes it easy to provide a user interface to the automatic test system. U.S. patent application Ser. No. 09/417034 entitled Easy to Program Automatic Test Equipment filed Oct. 12, 1999 by Kittross, et al. describes automatic test system that uses a combination of programming techniques to facilitate easy programming of a test while allowing very complex programs to be written. The foregoing are all hereby incorporated by reference.

The foregoing patents are assigned to Teradyne, Inc. of Boston, Mass., USA. Teradyne provides for its test systems a highly successful programming environment called IG-XL that employs techniques described in the foregoing patents.

Notwithstanding the success of that programming environment, it would be desirable to provide an improved software environment. We have recognized that one area for improvement comes about because traditional software for automatic test equipment contains drivers that run the tester hardware. It is traditional for testers to include hardware instruments that are specially adapted for certain test functions. For example, some instruments generate or measure RF signals. Other instruments generate digital signals, while others perform functions unique to testing of semiconductor memories. Instruments for a test system are often developed after the test system is released, either because a need for a new instrument is identified or because it is not possible to time development of a test system and all instruments to be available at the same time.

As new instruments are developed, the software environment must be modified to incorporate control of the new instruments. Traditionally, software has been modified by releasing new versions of the software. For testers, releasing new software can sometimes be a disadvantage. Semiconductor manufacturers often "qualify" test programs they have written to test the semiconductors they are manufacturing. The qualification step is important for the semiconductor manufacturer to have a high degree of confidence that devices that pass testing are actually good devices and those that fail testing are actually faulty devices. If a new release of the software is issued, it might be necessary for the semiconductor manufacturer to re-qualify all of its test programs.

We have also recognized that another area for improvement arises because of the rapid pace of technical advancement in the semiconductor industry. New generations of devices are developed that are usually larger and faster than the preceding generation, requiring new testers. It would be highly desirable if test programs could be quickly developed for the new generation of devices, even if they are tested on new testers.

SUMMARY OF THE INVENTION

With the foregoing background in mind, it is an object of the invention to provide a test system that can be easily reprogrammed to control new instruments without reloading the basic software.

In another aspect, the invention provides a method for manufacturing semiconductor devices that is simplified by providing self-contained instrument specific software.

The foregoing and other objects are achieved with automatic test system software that has software partitioned into general functions and instrument specific functions. The test system includes a mechanism to determine which instruments are installed and mechanisms by which software executing the general functions can access the instrument specific software and by which the instrument specific software can access the general functions.

In the preferred embodiment, the software performing general functions is implemented as a software that defines "core" functions and software that performs platform specific functions. Further, the software that performs instrument specific functions contains functional information related to the instrument and information describing the physical layout of the instrument on printed circuit boards. In use, an "instance" of an instrument is constructed by combining the functional and physical information. In this way, the same functional information about the instrument can be used, even if the physical layout is changed.

In the preferred embodiment, the software components are defined as COM (Common Object Model) objects with prescribed interfaces. The interfaces present a known format for accessing methods associated with the objects. The software is partitioned so that methods that are instrument specific are solely contained within the instrument specific software, yet the instrument specific software can access generalized functions to operate as an integral part of the ATE (Automatic Test Equipment) system.

BRIEF DESCRIPTION OF THE DRAWINGS

The invention will be better understood by reference to the following more detailed description and accompanying drawings in which.

DESCRIPTION OF THE PREFERRED EMBODIMENT

Figure 1:
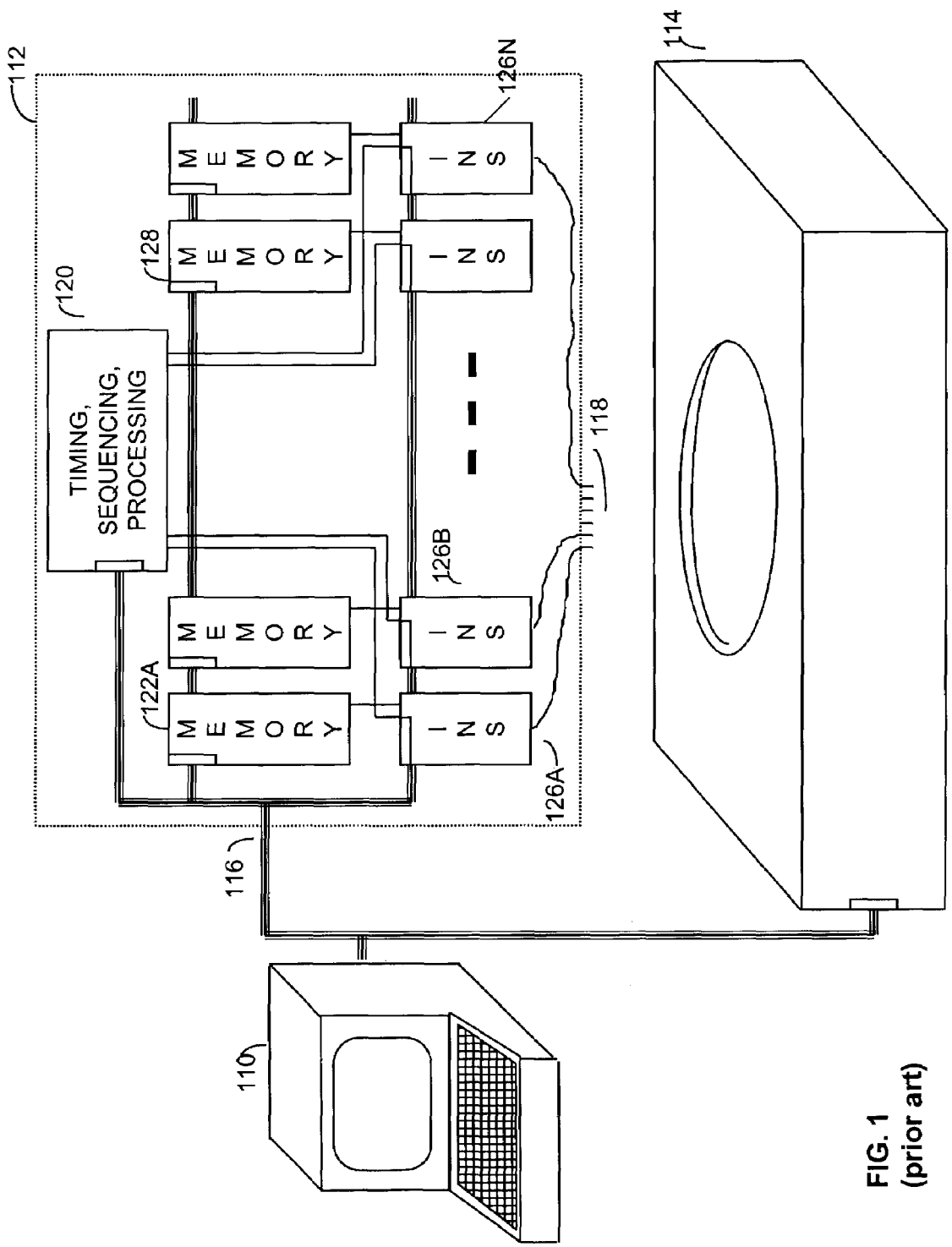
FIG. 1 is a block diagram of an automatic test system, such as might be found in the prior art.

FIG. 1 shows a generalized automatic test system of the prior art. To provide thorough and fast testing, the automatic test system generally includes a tester body 112, a computerized work station 110 and a handling device 114.

The computer work station 110 controls both the handling device 114 and the tester body 112. It controls the handling device 114 to position the semiconductor device (not shown) where it makes contacts with numerous test probes 118 on the tester body 112. Often, a tester will include a separate test head containing test probes 118. However, such a distinction is not important for the invention.

Work station 110 then controls tester body 112 to run a series of tests on the device under test. Each test generally includes a setup portion in which control signals are sent from the work station 110 to the tester body 112. The control signals are usually digital values sent over bus 116. These control signals configure the hardware within tester body 112 to make the measurements required for the test. The hardware within the tester body provides stimulus and measures responses from the device under test in accordance with the control signals.

In the preferred embodiment, work station 110 is a conventional personal computer running a Windows® operating system. Preferably, the operating system is Windows NT® operating system, Windows 2000® operating system, Windows XP® operating system or later version.

FIG. 1 shows that the hardware within tester body 112 includes numerous circuits identified as instruments INS 126A . . . 126N. Instruments can take on many forms. To test semiconductor components that generate or receive digital signals, some of the instruments INS 126A . . . 126N will contain "pins" or "digital channels." Each pin can be programmed to generate signals or makes measurements for one of the test probes 118. Each pin might provide or measure a static, or DC, signal. Alternatively, each pin might provide or measure changing data in what is sometimes called a "burst".

During a burst, tester body 120 is controlled by timing and sequencing circuit 120. Timing and sequencing circuit 120 causes each of the pins 124 to read a sequence of data values from an associated memory 128. Each data value indicates the type of signal the pin should apply or expect to measure at its associated test probe 118 at a specific point in time. If the pin compares a measurement to an expected value, the results might also be stored in memory 128.

Others of the instruments 126A . . . 126N perform other test functions. They might for example generate a specific test signal such as a sine wave. Alternatively, an instrument might sample a signal at a high rate so that it can later be analyzed by a digital signal processor. These functions might be performed as part of a burst or might be performed separate from a burst.

A full test of a part, sometimes called a "job", will consist of a series of bursts interspersed with DC measurements or measurements by instruments 126. The bursts might be used to measure specific functional attributes of the device under test. Alternatively, each burst might be used only to place the device under test into a state in which a DC measurement can be taken. The order in which these elements of a test are performed, sometimes called the "flow," is dictated by software in work station 110.

Each of the instruments 126A . . . 126N might contain circuitry that process the measurements made on a particular device under test. Alternatively, the raw data can be passed to work station 110 for processing according to software programs running on the work station. As yet a further option, the data might be passed to circuitry within tester body 112 denoted generally as timing, sequencing and processing circuitry 120. The precise location of the processing circuitry is not important. However, it is important that the software in work station 110 be adapted to control the required data processing. For this reason, any changes in hardware in a tester have generally required that the software in work station 110 be changed. However, as will be described below, the software of the preferred embodiment significantly reduces the need for such changes.

Once a device has been fully tested, or tested to the point where it is determined to be defective, work station 110 generates control signals to the handling device 114. Handling device 114 then presents the next device to be tested to tester body 112 and the process is repeated. Work station 110 also gathers data about whether particular devices passed or failed. It can process this data so that defective devices are discarded or it can perform other functions, such as analyzing the data for failure trends.

Figure 2:
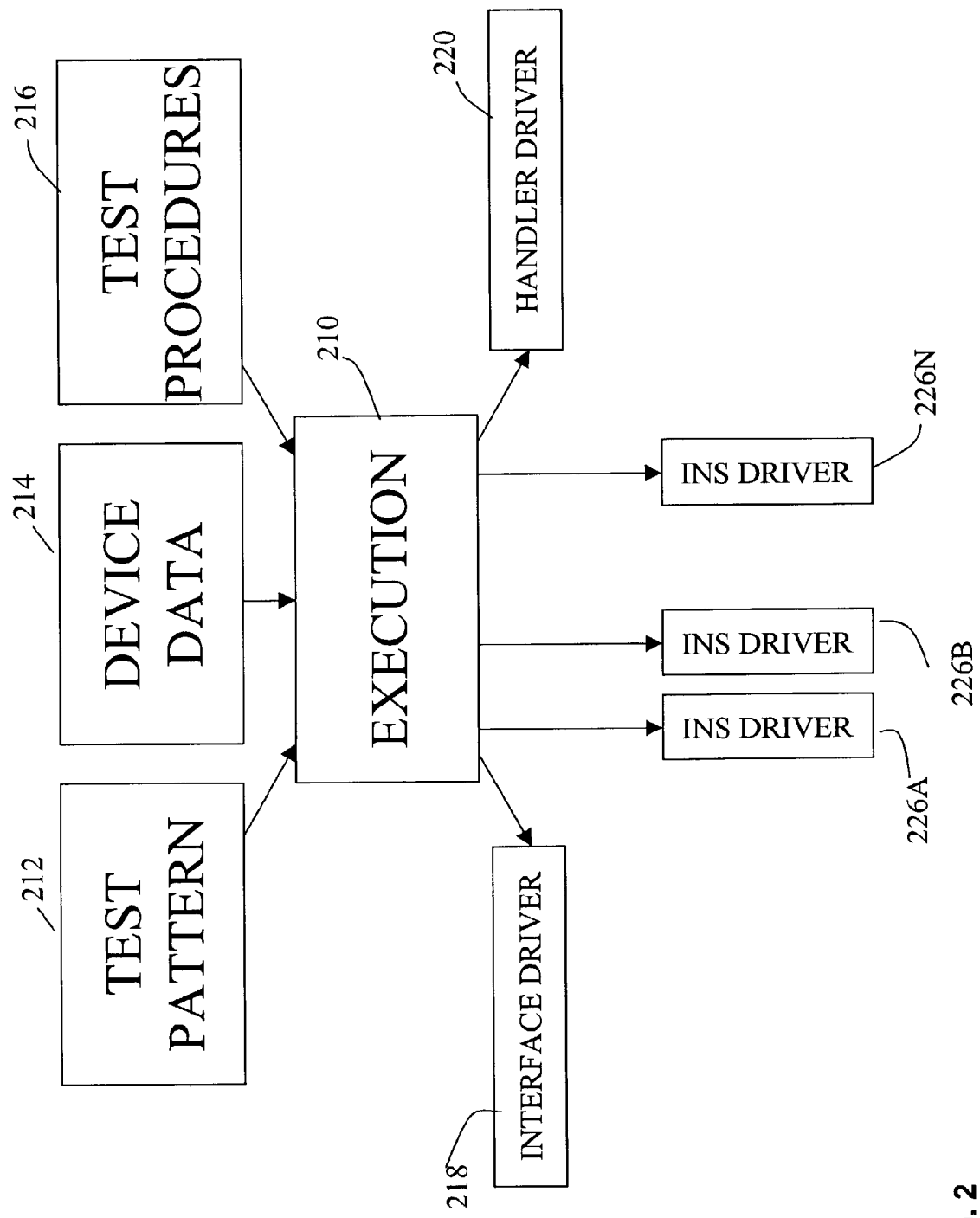
FIG. 2 is a functional block diagram of a prior art software architecture.

The above referenced US patents owned by Teradyne Inc. more fully describe a software system as in the prior art. As a brief summary, FIG. 2 shows a high level, functional block diagram of software according to the prior art. Execution of a job is performed by a certain set of software, labeled as execution software 210. A user specifies the flow of various test within a job. Execution software 210 follows this flow and draws on test procedures 216 and test patterns 212 to determine specific actions the test system is to take. Execution software 210 draws on device data 214 to translate this information into more specific commands for the tester, such as which instrument is connected to which lead of the device under test and therefore should generate a specific test signal.

Execution software 210 interfaces with various instrument drivers 226A . . . 226N. Each driver is software that controls hardware within tester 112. Interface driver 218 controls a user interface device, such as a computer screen, and provides data to and receives instructions from the user that might control execution of a job. Similarly, handler driver 220 controls the handler 114.

Figure 3:
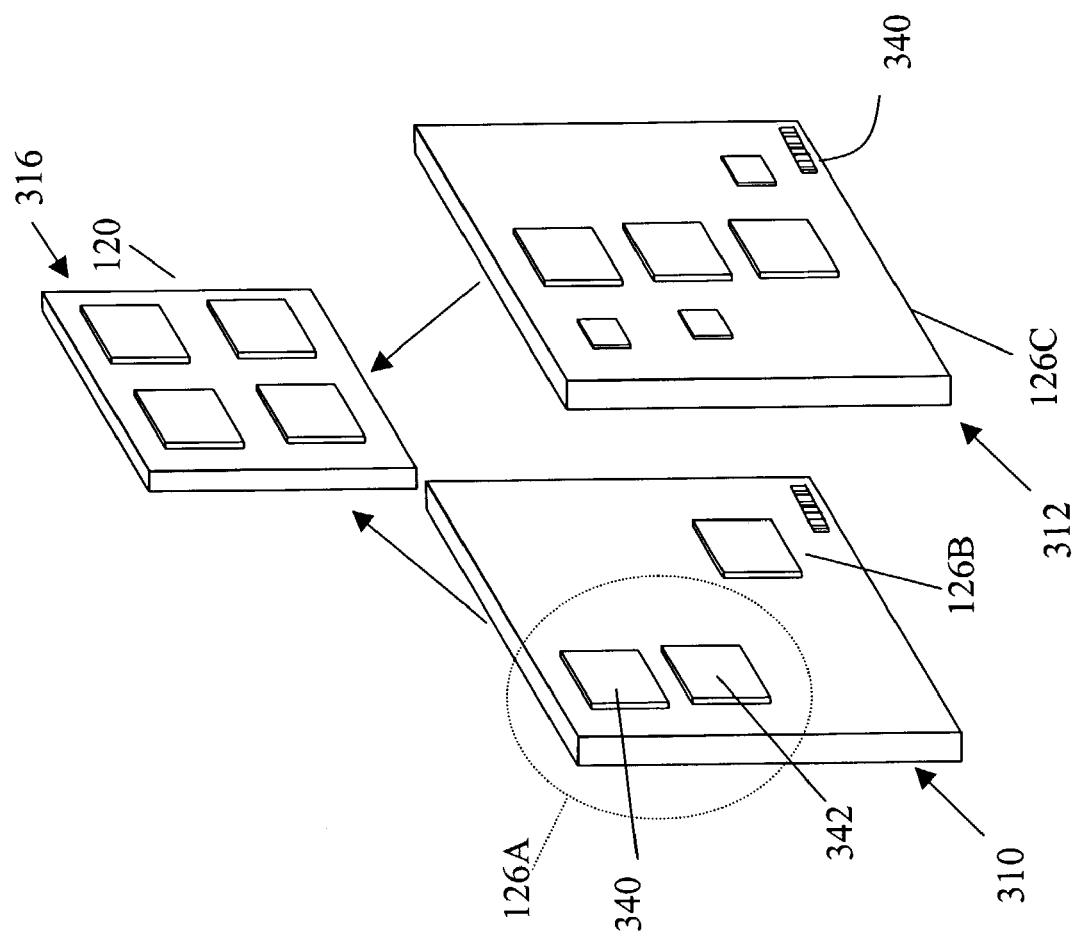
FIG. 3 is a sketch illustrating the placement of instruments on specific boards.

FIG. 3 shows the physical implementation of certain portions of tester body 112. The tester is assembled from printed circuit boards, such as 310, 312 and 316. Only a portion of the printed circuit boards are shown and the physical interconnection between the boards are omitted for clarity.

In the illustrated embodiment, semiconductor chips 340 and 342 are shown mounted to board 310. These chips might be, for example, application specific integrated circuits (ASICs). ASICs 340 and 342 are here shown to be the physical implementation of instrument 126A. The same board 310 is shown to also contain another ASIC that implements instrument 126B. Thus, two instruments might be implemented on a single printed circuit board.

Alternatively, board 312 is shown to contain many integrated circuit chips, but to implement only a single instrument 126C. Thus, the specific arrangement of instruments on boards might vary from instrument to instrument. As new boards are designed, the connection between instruments and boards might change. Such a change might occur, for example, if a tester manufacturer developed a new model of test system, but wanted to use instruments already developed for an earlier generation. Or, a tester manufacturer might provide a full line of testers, some for high performance and some for lower performance. It might be desirable to use the same instruments in each, though the boards used in each test system would be different. Physically, existing integrated circuits that make up an instrument can easily be placed on a board for a new test system. However, heretofore, substantial work has been required to adapt existing software for use with the instrument in a new board layout.

Board 316 represents one of the boards that might contain the circuitry making up timing, sequencing and processing circuitry 120. One common processing operation in a tester is to perform digital signal processing operations on measured data. Digital signal processing might be used, for example, to compute a frequency spectrum or identify zero crossings in the signal.

However, in some test systems, the digital signal processing circuitry might be physically mounted on a board that contains instruments. Heretofore, changing the architecture of a test system—even within the same product family—made it difficult to re-use software developed for one test system on a later tester in the family.

In a preferred embodiment, each of the boards that contains instruments, such as boards 310 and 312, contains a mechanism by which the specific board or board type can be identified by work station 110. It is known to place read only memories (ROMs) on printed circuit boards in testers that store ID information about the specific board. But, other ways can be used to identify boards. FIG. 3 shows that a bar code 340 is applied to each board, which might, for example, pass through a bar code reader as a board is inserted into the test system. The specific mechanism by which boards are identified is not important and FIG. 3 shows a bar code only as a visible representation that the board includes some mechanism by which the type of board can be identified.

Figure 4:
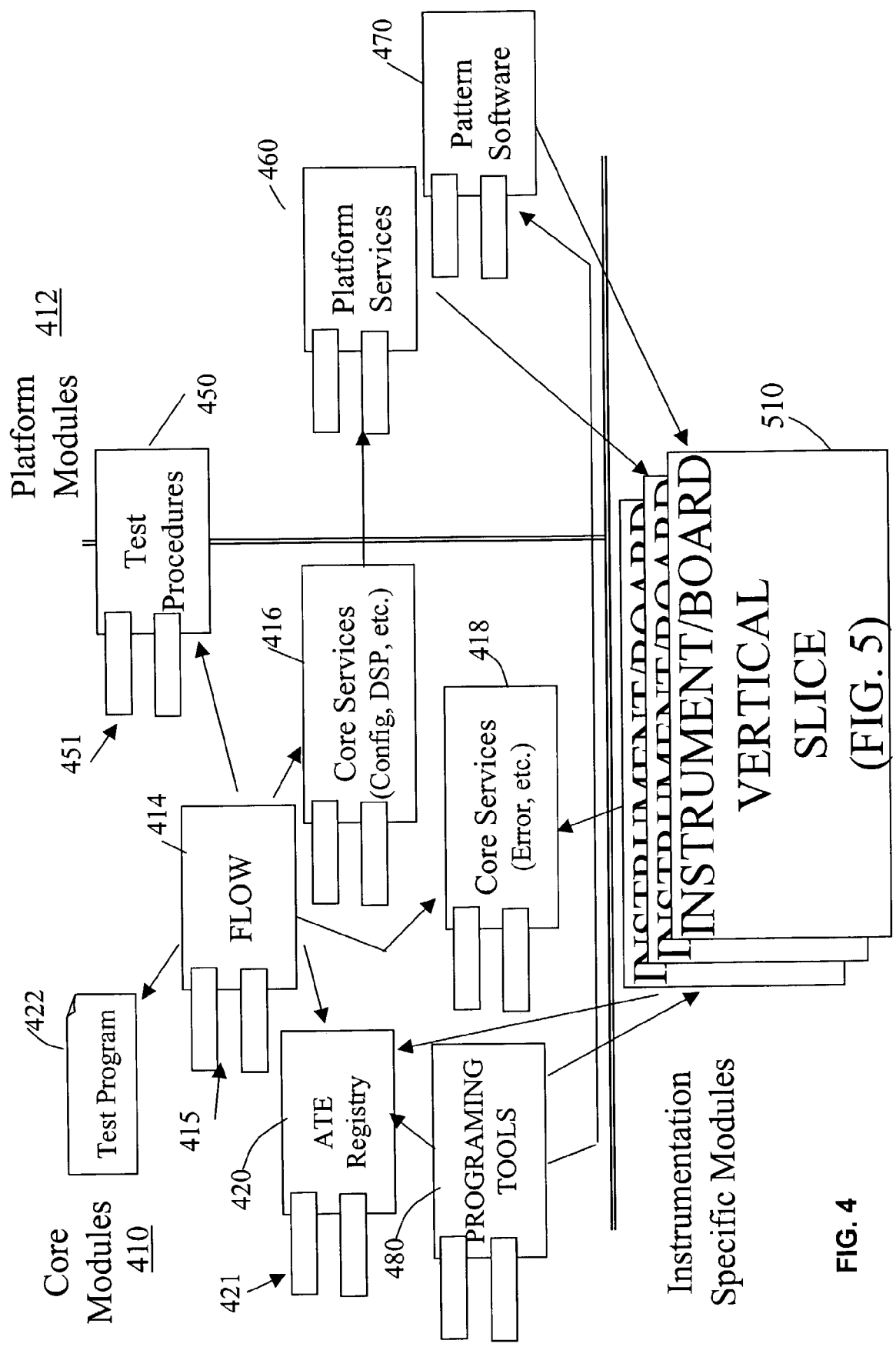
FIG. 4 is a functional block diagram of software using the present invention.

Turning now to FIG. 4, a functional block diagram of software for a test system using the invention is shown. FIG. 4 is shown to contain instrument/board vertical slice software 510 and instrument independent software. There are multiple copies of the instrument/board vertical slice software 510, with one copy corresponding to each instrument installed in the test system. Instrument independent software is shown in the illustrated embodiment to include core modules 410 and platform modules 412.

Instrument independent software is software that can be loaded into a tester and does not have to change when different instruments are installed or removed from the tester. It should be appreciated that the results of any processing done by instrument independent software could depend on data or commands generated by instruments, but the software is independent of the instruments if it does not have to be changed when a new instrument is added.

Platform modules 412 represent software that depends on the specific tester platform on which the software resides. For example, a tester manufacturer might have multiple testers within a product family. Each tester model could represent a "platform." Certain operations would be performed differently from platform to platform. For example, one platform might have a hardware digital signal processor that is capable of performing many functions. To perform a DSP function, software would control the test system to provide data to the DSP circuit and read the results. But, a different platform might not contain such DSP circuitry. In that case, when a DSP operation was required by a test job, software would have to control the tester to pass the data to work station 110 where software algorithms would use the general purpose computer to perform DSP functions. The same operation might be performed, but the specific functions implemented by the software would vary from platform to platform based on the underlying hardware design. Ideally, all software that depends on underlying hardware that might vary from platform to platform would be implemented as one of the platform modules 412.

It should be appreciated that instruments also change the underlying hardware and might vary from tester to tester based on which instruments are installed. Platform modules 412 differ from instrument specific modules in that they provide the software to perform functions that will be performed the same on all testers of the same type platform regardless of which instruments are installed. Platform modules 412 can accordingly be loaded into a test system at the time it is manufactured. In contrast, instruments might be added or removed from a tester during its life. Instrument specific modules might be added or removed throughout the life of a tester.

Core modules 410 are the second type of instrument independent software in the illustrated embodiment. As with platform modules 412, these modules do not have to be changed when an instrument is added or removed from the test system. Data or commands provided by an instrument might alter the functions or results achieved by core modules 410, but the software does not need to be changed when instruments are added or removed. In the preferred embodiment, core modules contain software that does not depend on the architecture of the test system that might be changed in subsequent platforms.

To enable segregating the software into an instrument/board vertical slice and instrument independent software, it is necessary that the functions be allocated appropriately. In a preferred implementation, each functional block represents an object or a collection of objects. To enable the system to operate, despite the fact that it contains multiple objects, there must be defined interfaces between the objects. Object oriented programming is known in the art and techniques for creating software objects are known.

In a preferred embodiment, much of the software is written in the C++ language. However, COM/ATL technology is used to define interfaces between objects. COM is a technology provided by Microsoft Corporation of Redmond, Wash. that aids in the creation of software objects that can then be interfaced.

FIG. 4 shows various core modules 410. The specific numbers and types of such core modules will vary from implementation to implementation and the modules shown should be understood to be representative of core modules that might exist in a test system rather than a limitation of the ones that could or must exist. In the illustrated embodiment, each of the core modules is implemented as a programming construct known as a "package."

Flow module 414 performs the processing the controls the execution of a test job. As in the prior art, flow relies on test procedures, which are here illustrated as test procedures 450. User supplied test program 422, including data about the device being tested, is accessed by flow module 414.

Flow module 414 and test procedures 450 are implemented as packages that have defined interfaces, represented as interfaces 415 and 451. In this way, modularity of the software is greatly increased. Various ways to implement an interface are known. In the preferred implementation, the interface uses COM technology and exposes "methods" of the package. Each "method" represents something the package can do in response to a request from another package. In the illustrated embodiment, interface 415 exposes as methods functions that were traditionally performed by flow software needed to run a test job.

In FIG. 4, test procedures 450 are shown to be both a core module and a platform module. This illustration indicates that the package might contain some elements that are platform dependent and some that are not. In the preferred implementation, the interface to test procedures module 450 is the same for all platforms, even if some of the actual coding within the modules changes from platform to platform.

Flow module 414 controls the execution of a test job. As part of a test job, the underlying hardware of the tester, including instruments, must be controlled. However, because flow module 414 is a core module, it is designed to be independent of platform specific hardware and instrument specific hardware. Thus, a mechanism must be provided to access instruments that is not instrument specific.

ATE registry module 420 provides this mechanism. ATE registry 420 maintains a list of all instruments installed in the tester.

Each instrument added to the system results in an entry in ATE registry 420. Various mechanisms could be used to make an entry in the registry. One way is to have a user run an install program on work station 110.

Identifying new hardware in a computer is known. For example, the Windows® plug and play feature is able to perform this function for computer peripherals. In this case, there are two additional complexities. First, boards are not being directly installed into work station 110. Rather, they are being installed into tester body 112. Second, the software architecture of the preferred embodiment recognizes instruments rather than boards. Preferably, the software does not require any fixed relationship between a specific boards and instruments.

In the preferred embodiment, during startup and initialization the ATE Registry reads data from a persistent storage mechanism. This data is written at the time that instrument software is loaded onto workstation 110. The exact way in which the software is loaded and the time at which that occurs is not crucial to the invention. In the preferred embodiment the Windows® Registry function is used as a persistent storage mechanism for data accessed through the ATE Registry although other persistent storage mechanisms such as ASCII files could be used just as easily.

Figure 5:
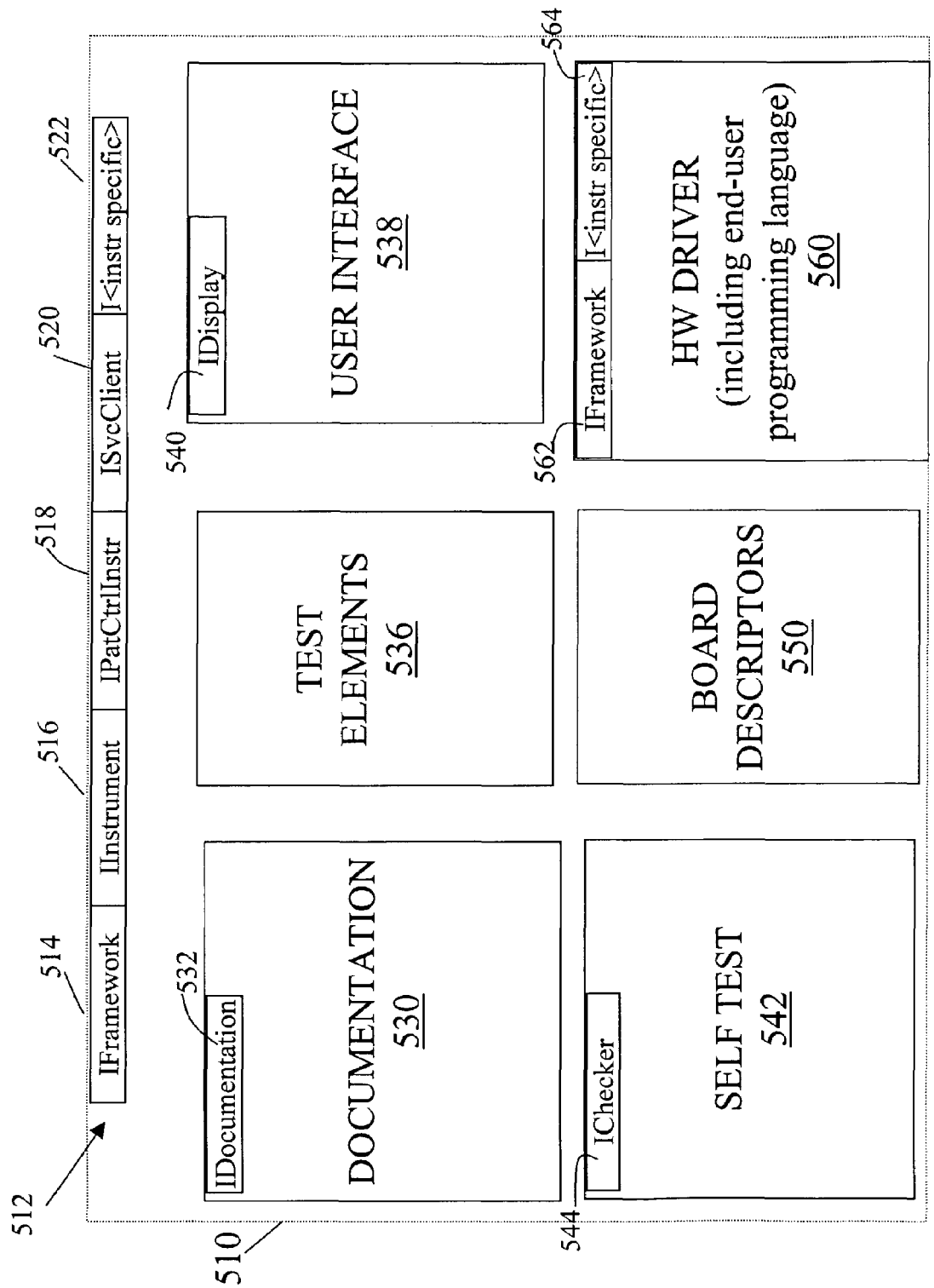
FIG. 5 is a schematic representation showing greater detail of the instrument software of FIG. 4.

To correlate instruments to a board that is installed in the test system, vertical slice 510 includes software loaded into work station 110 that describes the instruments associated with a specific board. This software is illustrated as board descriptors 550 (FIG. 5). Board descriptor 550 contains the information necessary to complete an entry in the ATE registry for each instrument on the board with which the descriptor is associated.

The precise form of the entry in ATE registry 420 is not critical to the invention. The entry should, however, contain the information necessary for other software packages to access the instrument, when needed. This information will include an identification of the instruments and how they can be addressed.

For example, flow module 414 might execute a user supplied test program that requires generating commands to the instrument. In this case, it is necessary for flow module 414 to initiate communications with the instrument. This communication is implemented using information about the instrument from ATE registry 420. In some cases the information about the instrument that came from the ATE registry may have been 'cached' and the software may not actually get the data from the ATE registry each time it might be needed. This optimization improves the performance of the overall system, but is a technique which is known and is not unique to the invention.

Other examples, various programming tools 480 might display lists of choices that the user might select when writing a program. If any choices depend on which instruments are installed, the programming tool might review the entries in ATE registry and present as choices only those instruments in the ATE registry. In this way, a test program would only be written to match the hardware that exists in the test system.

As with the other packages, ATE registry 420 has a defined interface 421. In this way, any vertical slice component can be developed that access a method within ATE registry 420, causing the appropriate entry to be made in the registry.

In a similar manner, test programs or program development activities might require information or execution of functions that are not instrument specific. These tasks are provided in the illustrated embodiment as services. Within core modules 410, two service packages 416 and 418 are shown. Core services 418 represent services that have no platform dependent component.

For example, the method used in responding to an error does not need to change based on specific platform hardware or instrumentation installed. Software associated with different hardware might pass different data through the interface to core services 418 to describe different types of errors that have occurred. Different data might, for example, cause different messages to be displayed to a user. But the function of displaying a message would be both instrument and platform independent and any software can access those functions through the error handling interface. FIG. 4 illustrates this possibility by indicating that a core module, such as flow package 414 can access the error handling services through the interface to package 418 as can instrument specific software within the vertical slice 510.

Other services might depend on the hardware within a platform. For example, some tester models might have flashing alarm lights that indicate a problem while others have audible alarms and others signal an alarm by sending an e-mail to a user. Nonetheless, reporting an alarm condition to a user might be a core service that every tester should perform. Thus, alarm might be a service within package 416 that is accessible through the interface to package 416. To actually make the tester perform an action that is appropriate for the particular tester platform, package 416 access platform services package 460. In the alarm example, the interface to platform services package 460 exposes a method for responding to an alarm. The interface would be the same for every tester platform. However, the specific software within platform services 460 would be different for different tester platforms.

Other services that are preferably available for every tester, regardless of platform, but depend for specific implementation on the platform hardware, are also included in core services package 416. But, a portion of the service might be supplied by accessing software included within platform services package 460. Examples other such services are DSP (digital signal processing), which might be implemented in hardware that differs from platform to platform.

Config is an example of another service, which should be available for all testers, but will be implemented differently on different platforms. As described above, the tester should support certain types of actions, regardless of the specific hardware. However, specific hardware configuration can influence how those actions are carried out. The Config service determines the specific configuration installed and provides data about what that hardware is capable of doing. One example described above relates to whether or not certain instruments are installed in the tester and on which boards those instruments reside on. A method to perform this association might be included within the ATE registry 420 or might be included as part of the Config service.

Beyond knowing what instruments are present, some test programs might require knowledge of the specific capabilities of the instruments installed or the specific platform. For example, a digital instrument might be sold in different versions, with one having more channels or being capable of operating at a higher clock rate. In the preferred embodiment, the Config service contains methods that obtain and provide data on the capabilities of the specific hardware in a tester. Because some of this data will depend on the specific platform, the Config service is shown as part of the core services package 416 that accesses platform services 460. Platform services package 460 is drawn to illustrate that it can access vertical slice 510. Vertical slice 510 contains software, with a defined interface, that can provide information about the underlying hardware of an instrument in the system.

FIG. 4 also shows a package containing pattern software 470. Patterns software performs methods that allows a user to create the pattern of signals that is applied to a device under test during a "burst." Such tools are known in the testing art and perform functions such as compiling a pattern file from a computer generated description or loading the pattern file into pattern memory within tester body 112. These functions depend on the specific configuration of the platform hardware and might depend on the specific instruments installed. Therefore, FIG. 4 shows that pattern software 470 is accessed by programming tools 480 and in turn can access the underlying instrument hardware.

Each package interface for instrument independent packages, such as interface 415 or 421, is shown to have two pieces. This representation indicates a framework interface and a package specific interface. Each package in the system will generally have to perform functions that are common to every package in the system. For example, every package might need to respond to commands such as start-up, shut down and reset. While the specific action taken by each package in response to each of these commands might be different, every package in the described embodiment needs to receive and respond to such commands. Other functions performed by a package will be package specific. The common functions are part of the framework interface. The other functions are exposed through the package specific interface. However, this division of the interface is not crucial to the invention In the presently preferred embodiment, the package specific interface is further divided into two pieces. One part of the package specific interface defines user visible "language." Language represents programming constructs that can be used in writing user programs for the test system. For example, a package the provides DSP services would need to provide some form of DSP language so that a user can invoke DSP functions from a test program. There are many ways that language can be exposed, but the use of COM technology provides one easy mechanism. Other convenient software component technologies such as CORBA or Java Beans could also be used.

One advantage offered by the preferred embodiment of the invention is that the "appearance" to the user is of a single seamless and consistent software system. The fact that there are boards and instruments that are controlled by software objects that are not independent of the core software is transparent to the end user of the software. An example of this concept might relate to the user programming language. Although there may be multiple boards and instruments, the language is accessed through one mechanism where all boards and instruments present in tester body 112 are accessible.

Turning now to FIG. 5, an illustration of a software component delivered with an instrument board is shown. The component is the implementation of one of the vertical slice 510.

The component contains packages that provide an interface 512. The interface contains several pieces. As with instrument independent packages, there is a framework interface 514 providing an interface to invoke the functions that are common to all packages in the system. They perform functions such as start, stop and reset.

Another part of the interface, instrument interface 516, reveals methods that are common to all instruments. It might be desirable to have instruments respond to a command that causes them to report their state or to enter a predefined state. Such commands would be exposed through the instrument interface 516. For example, an instrument might have a "clean" and "dirty" state. "Dirty" means that the instrument is in a state in which it might impact signal levels at one of the test probes 118. Methods exposed through the instrument interface might report on the state, might move an instrument to a clean state or might enable an instrument to enter a dirty state.

Instruments might also have to take action in response to timing signals. Testers often include pattern control circuitry that synchronizes execution of events while a burst is running. Methods to cause an instrument to perform functions according to the desired timing might be exposed through the pattern control interface 518.

Another aspect of the interface might allow the instrument to respond to packages that provide services. For example, all instruments might be required to respond to alarm or error handling services the same way. Such interactions might be controlled through service client interface 520.

Because instruments will generally perform functions unique to an instrument, each instrument will generally have an instrument specific interface 522. As above, the device specific interface might reveal user language that can be incorporated by a user into a program that runs on a tester containing that instrument.

The software that controls an instrument is contained as part of the hardware drivers 560. Hardware driver 560 is similar to instrument drivers as used in the prior art. However, it is implemented as a package that can be incorporated into a system using COM technology. As such, the hardware drivers use the framework interface and also the instrument specific interface. Most end-user language for an instrument will likely be related to operation of the hardware.

However, a vertical slice must contain more than just hardware drivers. As described above, it is necessary that ATE registry 420 and the config service know the correlation between specific boards installed in a system and specific instruments. Preferably, information about the instruments on a board will be included in board descriptors 550.

It should be noted that in the case where there is more than one type of instrument on a board, the vertical slice component that goes with that board might contain multiple copies of hardware drivers, display, self test documentation or other elements that are instrument, rather than board, specific.

As described above, it is highly desirable if all software that is unique to a specific instrument is encoded in a vertical slice. Software that presents user displays that are specific to a particular type of instrument therefore must be included in the software component that contains the vertical slice. Thus, vertical slice 510 is shown to contain a user interface package 538. This package has an interface that allows other packages to access the display or user interface functions. For example, a method of this user interface package might present a graphical user interface that allows a user to specify operating parameters for the instrument. Other methods might present a debug display that, when invoked, displays the state of the instrument.

In addition, it is desirable that each instrument perform some self test or calibration functions. Self test might be performed in the factory, when an instrument is first installed or at any time during the lifetime of a tester. While it is desirable for every instrument to perform a self test when a self-test on the tester is performed, the specific actions that will be undertaken to test each instrument will be different. Thus, there might be a core service that initiates a self test. But, that core service must interface with instrument specific software, represented as a self test package 542.

Additionally, each instrument is likely to be useful in performing certain types of tests. It would be an advantage if test elements designed to aid a user in programming tests of that type were available to the user. Thus, vertical slice 510 is shown to contain test elements 536. Test elements 536 could, for example, be commonly used test techniques specifically adapted for running tests in which the instrument associated with the illustrated vertical slice of software.

It is also desirable if the functioning of an instrument is described in documentation available to a user. While provision of documentation, including searching of a document or providing context sensitive help might be a function of general applicability, the information provided to the user sometimes needs to be instrument specific. Thus, vertical slice 510 is shown to contain instrument specific documentation. The documentation is shown to be in a package that has a documentation interface 532. In this way, core services can access the instrument specific documentation.

Having described one embodiment, numerous alternative embodiments or variations might be made. For example, it was described that core modules and platform modules are installed in a test system when it is manufactured. Such an implementation is not intended to be a limitation on the invention. Often, software is enhanced or maintained so that new releases of software are installed in a tester after manufacture. Further, it is not necessary that software supplied with a tester be added at the factory where the tester is manufactured. It might be physically installed after a tester is delivered and setup for a customer.

Also, it is described that C++ is used as a programming language for many objects within the system. Some objects might be written in Visual Basic or any other convenient software language. Further, it should be appreciated that terms such as "package" and "method" are used and these terms can have specific meaning when used in relation to a specific programming language. However, use of those terms does not imply that it is necessary to use a programming language or system in which those terms are used to describe constructs. They are used more generally to describe identifiable collections of software and the functions they can perform.

Further, it was described that instrument specific software is loaded into work station 110. The specific mechanism by which software is accessible to work station 110 is not important to the invention and an indication that software is "loaded" on the work station should be broadly interpreted to mean that it is accessible to programs running on the work station. Software might be loaded by copying it to the internal storage of the work station. It might alternatively be loaded by inserting some form a removal media, like a CD or a floppy disk. A further possibility is that the software might be loaded by access over the Internet.

Moreover, general functions are shown as partitioned into core modules and platform modules. This partition is made based on a judgment one whether hardware will change from platform to platform. Thus, the specific partitioning is not crucial to the invention and could change over time.

Further, it should be appreciated that components are partitioned into packages in a manner convenient for implementation. The specific partitioning might vary from implementation to implementation. In particular, there might be some instruments that will be included in virtually every test system. The software for controlling such instruments could be incorporated into the core or platform modules without detracting from the benefits of the invention.

It should also be appreciated that the specific packages selected to illustrate partitioning of the software are not an exhaustive list of packages that could be in a tester. In a commercially available tester, many more packages would be included. For example there would likely be packages that record data from tests. Other packages would likely control timing, such as the rate at which digital test signals are applied to a device under test. Other packages would likely provide more complicated test management functions, like controlling groups of test probes 118 so that each group creates a "site" at which a device under test is tested, so that the tester could test multiple devices simultaneously.

It was described above that the ATE registry knows which instruments might possibly be available on the tester by running an initialization program at the time an instrument is installed. An alternative is to have a system start-up program run on work station 110. Because each board added to the system, such as 310 or 312 contains an identification mechanism, a start-up program can determine whether any new boards have been added to the system. Identifying a new board can trigger actions that result in the appropriate entries being made in the ATE registry. However, the latter mechanism generally requires a standard format for communicating with every instrument. Running an initialization program when an instrument is installed in a tester is presently preferred because the initialization program, because it can be packaged with the instrument, can contain instrument specific features.

Still other variations might relate to the integration of the tester into larger computer aided manufacturing systems or to integration with semiconductor design systems. Many other variations are possible.

Therefore, the invention should be limited only by the spirit and scope of the appended claims.

What is claimed is:

1. A method for use with an automatic test system that is configured to test a device, the automatic test system containing instrument independent software, the method comprising:

installing a vertical slice comprising an instrument and an instrument specific software component in the automatic test system, the instrument specific software component comprising a driver for the instrument and additional software relating to the instrument; and using the automatic test system, including the instrument, through an interface between the instrument independent software and the instrument specific software;

wherein the interface comprises:

a framework interface to expose functions that are common to plural software modules in the automatic test system to the instrument specific software component;

an instrument interface to expose functions that are common to plural instruments in the automatic test system to the instrument specific software component; and an instrument-specific interface to expose language that can be incorporated into a test program to perform tests using the instrument.

2. The method of claim 1, wherein the instrument independent software and the instrument specific software component comprise plural packages.

3. The method of claim 2, wherein the packages are implemented with COM (Component Object Model) technology.

4. The method of claim 2, wherein the language that can be included in the test program controls functioning of the instrument.

5. The method of claim 2, wherein the instrument specific software component contains documentation about the instrument that is displayed using tools within the instrument independent software.

6. The method of claim 2, wherein the instrument specific software component comprises a display package that presents displays related to the instrument to a user of the automatic test system.

7. The method of claim 6, wherein the display package presents programming and debug displays in response to being accessed through an interface by programming and tools within the instrument independent software.

8. The method of claim 2, wherein the instrument specific software component contains self test software for testing the instrument in response to being accessed through an interface.

9. The method of claim 2, wherein the instrument specific software component contains test elements for incorporation into test jobs run by the automatic test system to create tests utilizing the instrument.

10. The method of claim 1, wherein the instrument specific software component contains software for controlling the instrument and software for presenting displays related to control of the instrument.

11. The method of claim 1, wherein the automatic test system comprises additional instruments comprising instrument specific software components that contain interfaces through which the additional instruments are accessed, each interface exposing methods to cause a corresponding instrument to perform actions, and each interface for exposing common methods.

12. The method of claim 11, wherein the common methods include a method to reset an instrument.

13. The method of claim 11, wherein the common methods include a method to cause an instrument to report a status of the instrument.

14. The method of claim 1, using the automatic test system includes running a startup program to create an inventory of instruments installed in the automatic test system.

15. The method of claim 1, wherein the vertical slice comprises a board that includes an identification mechanism and the automatic test system is configured to run a startup program to access the identification mechanism.

16. The method of claim 1, wherein the vertical slice comprises a board and the instrument specific software component includes a description of instruments on the board.

17. A process of manufacturing semiconductor devices using the method of claim 1, wherein the automatic test system, including the instrument, is used to test semiconductor devices during manufacture, and wherein processing steps in a manufacturing process are selected based on results of testing.

18. The process of manufacturing semiconductor devices of claim 17, wherein the processing steps include segregating semiconductor devices into performance categories based on the results of the testing.

19. The process of manufacturing semiconductor devices of claim 17, wherein the processing steps include selecting for packaging semiconductor devices that pass testing.

* * * * *